United States Patent
Wu et al.

(10) Patent No.: US 9,075,103 B2
(45) Date of Patent: Jul. 7, 2015

(54) TEST STRUCTURE FOR WAFER ACCEPTANCE TEST AND TEST PROCESS FOR PROBECARD NEEDLES

(71) Applicants: Qiong Wu, Singapore (SG); Chien-Ming Lan, Singapore (SG)

(72) Inventors: Qiong Wu, Singapore (SG); Chien-Ming Lan, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 237 days.

(21) Appl. No.: 13/645,789

(22) Filed: Oct. 5, 2012

(65) Prior Publication Data

US 2014/0097862 A1   Apr. 10, 2014

(51) Int. Cl.
*G01R 31/28* (2006.01)
*G01R 35/00* (2006.01)
*G01R 1/073* (2006.01)

(52) U.S. Cl.
CPC ........ *G01R 31/2831* (2013.01); *G01R 1/07307* (2013.01); *G01R 35/00* (2013.01)

(58) Field of Classification Search
CPC ........... G01R 1/06794; G01R 31/2886; G01R 31/2891
USPC .......... 324/754.03, 0.08, 0.09, 0.1, 0.11, 763, 324/758, 765; 257/48
See application file for complete search history.

(56) References Cited

U.S. PATENT DOCUMENTS

| | | | |
|---|---|---|---|
| 5,654,582 A * | 8/1997 | Kijima et al. | 257/620 |
| 6,379,982 B1 * | 4/2002 | Ahn et al. | 438/14 |
| 6,989,682 B1 * | 1/2006 | Shen et al. | 324/754.1 |
| 7,279,707 B2 * | 10/2007 | Chen et al. | 257/48 |
| 7,388,385 B1 * | 6/2008 | Iacob | 324/691 |
| 7,663,163 B2 * | 2/2010 | Ojiro | 257/203 |
| 2001/0014959 A1 * | 8/2001 | Whetsel | 714/724 |
| 2005/0280434 A1 * | 12/2005 | Whetsel | 324/765 |
| 2006/0109014 A1 * | 5/2006 | Chao et al. | 324/754 |
| 2008/0048689 A1 * | 2/2008 | Lee | 324/754 |
| 2008/0277659 A1 * | 11/2008 | Hsu et al. | 257/48 |
| 2009/0212793 A1 * | 8/2009 | Guldi et al. | 324/751 |
| 2009/0243645 A1 * | 10/2009 | Shinkawata | 324/765 |
| 2010/0163871 A1 * | 7/2010 | Brambilla et al. | 257/48 |
| 2010/0224874 A1 * | 9/2010 | Sasaki | 257/48 |
| 2012/0299610 A1 * | 11/2012 | Bieck | 324/754.03 |
| 2013/0001552 A1 * | 1/2013 | Matusiewicz | 257/48 |

OTHER PUBLICATIONS

Trade Secret—Wu, Qiong et al., United Microelectronic Corp invention disclosure, Title: New Probecard Monitor Structure to Avoid Device Damaged by Inline Sampling, dated Sep. 2, 2010, total of 10 pages.

* cited by examiner

*Primary Examiner* — Arleen M Vazquez
*Assistant Examiner* — Dominic Hawkins
(74) *Attorney, Agent, or Firm* — J.C. Patents

(57) ABSTRACT

Provided is a test structure for wafer acceptance test (WAT). The test structure includes a row of a plurality of first pads electrically connecting to each other, a second pad, a third pad, a first peripheral metal line, and a second peripheral metal line. The second pad is disposed in the vicinity of a first end of the row, wherein the second pad is electrically disconnected to the first pads. The third pad is disposed in the vicinity of a second end of the row, wherein the third pad is electrically disconnected to the first pads. The first peripheral metal line is disposed at a first side of the row and electrically connected to the second pad. The second peripheral metal line is disposed at a second side of the row and electrically connected to the third pad.

15 Claims, 5 Drawing Sheets

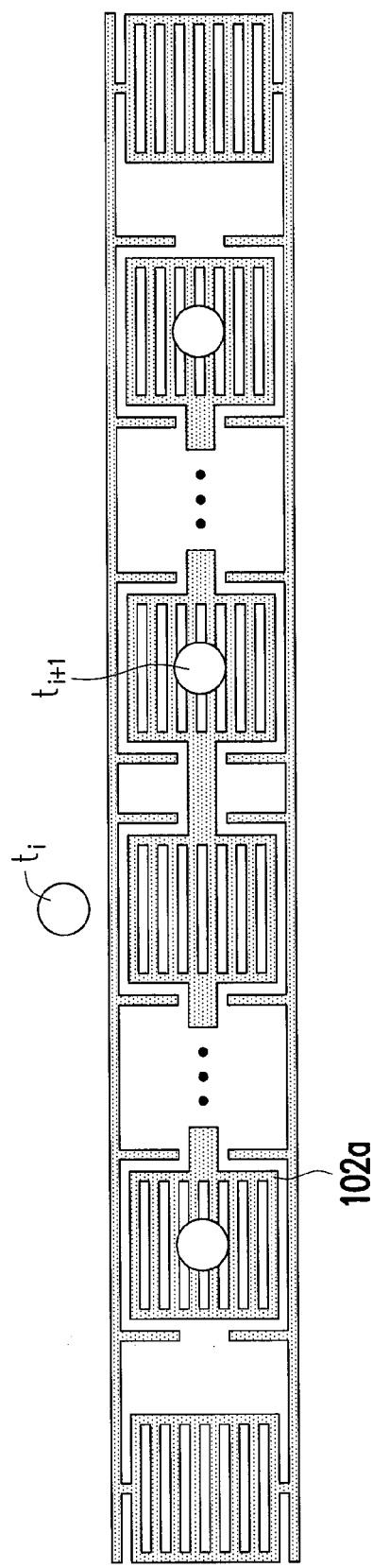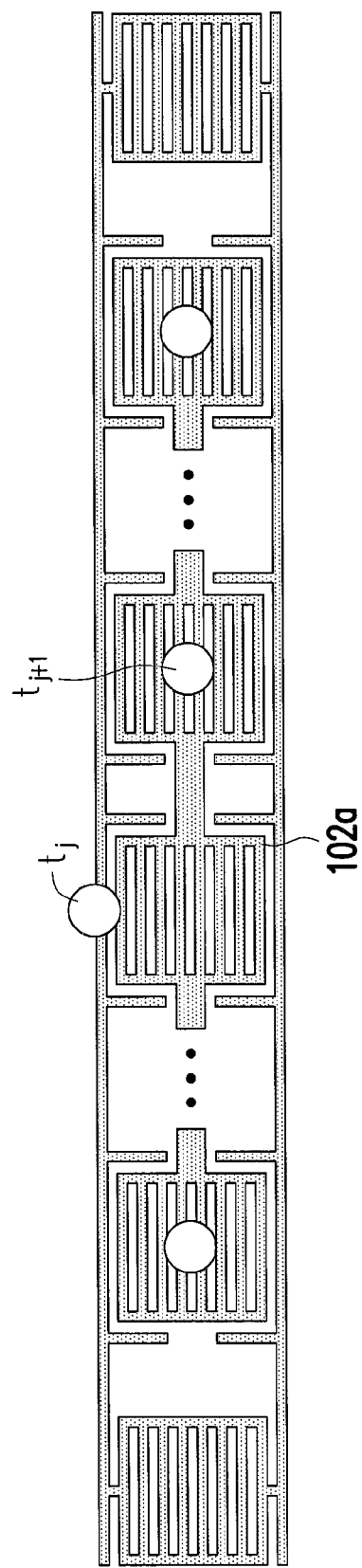
FIG. 3A
FIG. 3B

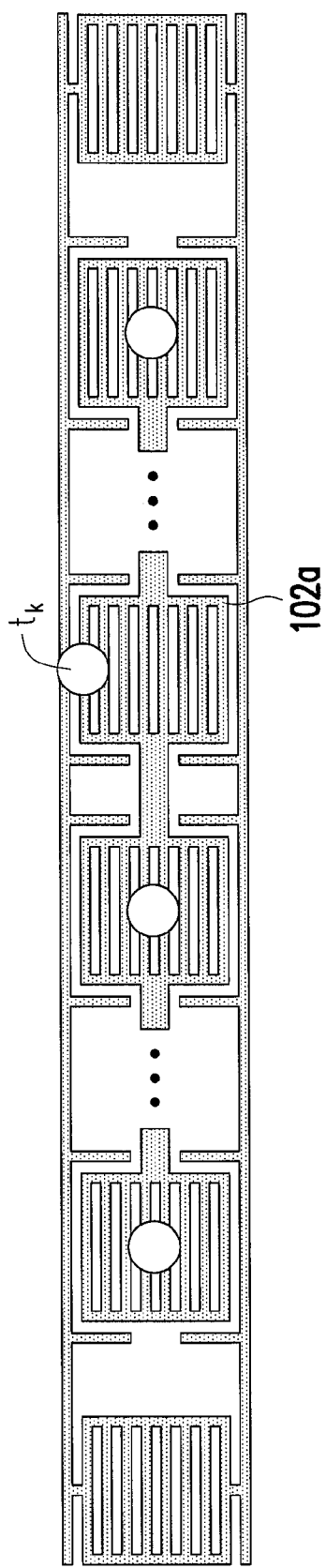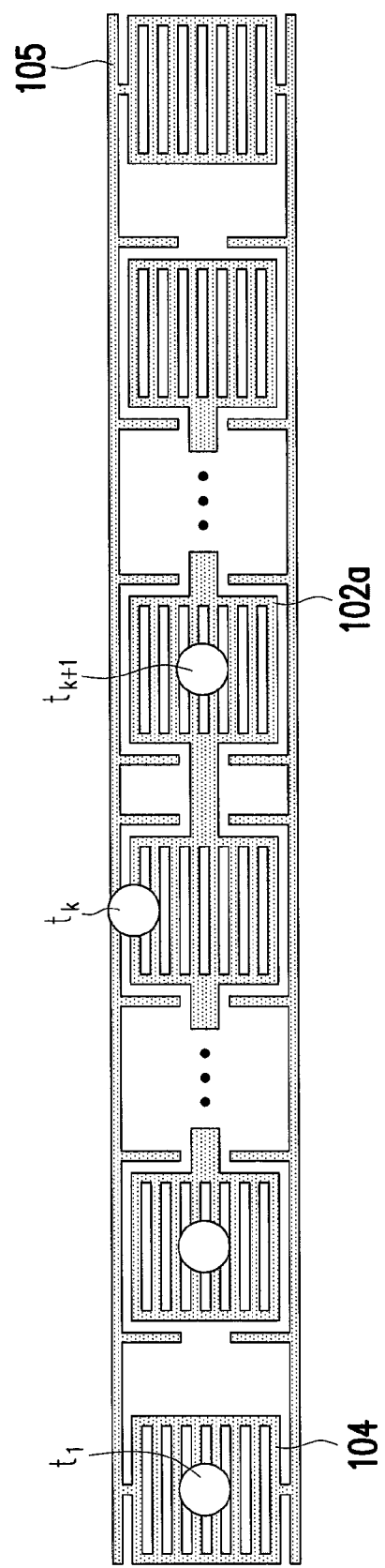
FIG. 3C
FIG. 3D

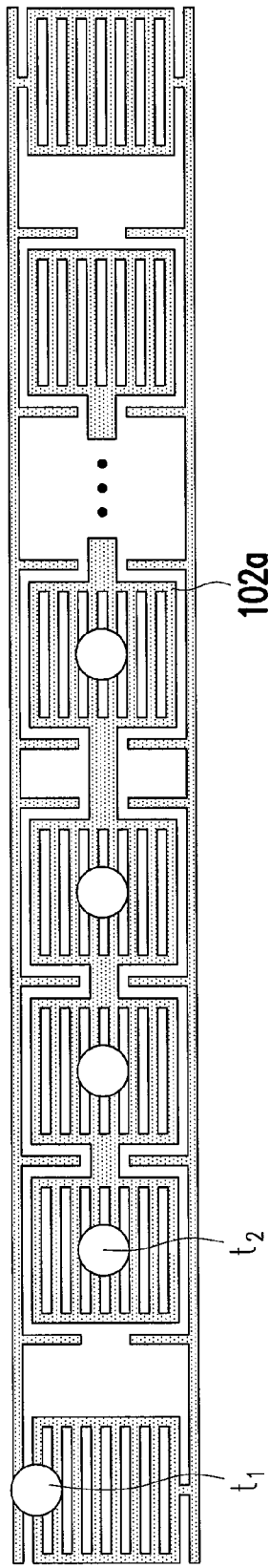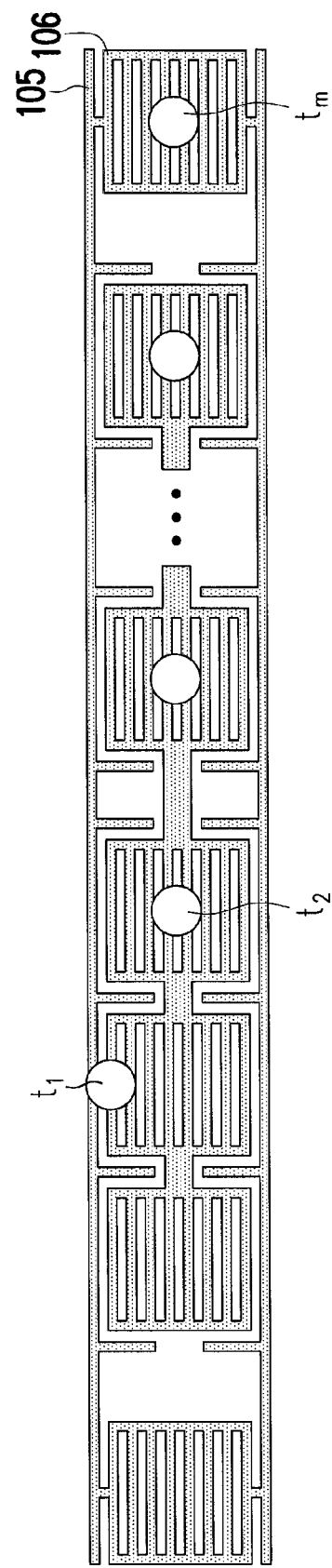
FIG. 3E
FIG. 3F

TEST STRUCTURE FOR WAFER ACCEPTANCE TEST AND TEST PROCESS FOR PROBECARD NEEDLES

BACKGROUND

1. Field of Invention

The present invention relates to semiconductor device fabrication; more particularly, the present invention relates to a test structure for wafer acceptance test (WAT) and a test process for probecard needles.

2. Description of Related Art

Wafer-level test plays an essential role in semiconductor device fabrication. By the testing, defective dices (chips) are identified and may be discarded before they undergo the post-processing, thereby reducing the waste of cost. Being one of such wafer-level tests, the wafer acceptance test includes various electrical tests on the pads disposed around the peripheral regions of a dice. The main purposes of the wafer acceptance test are to confirm the reliability of the fabrication process and to enhance the yield of dices.

Wafer acceptance test may be conducted via a probecard with a plurality of probecard needles. Upon testing of a single wafer, the probecard may contact the wafer for tens of thousand times. A common issue arises when a probecard needle deforms, deviates from its original position, or is blunted as a result of the mechanical impact of the contacts. If a probecard needle is in its anomalous state (e.g. deformed, deviated from the original position, or blunted), it may damage the other components such as metal routing on the wafer during the subsequent tests. There is thus a need for a test process for the normality of the probecard.

SUMMARY

The first aspect of the invention provides a test structure for wafer acceptance test (WAT). The test structure includes a row of a plurality of first pads electrically connecting to each other, a second pad, a third pad, a first peripheral metal line, and a second peripheral metal line. The second pad is disposed in the vicinity of a first end of the row, wherein the second pad is electrically disconnected to the first pads. The third pad is disposed in the vicinity of a second end of the row, wherein the third pad is electrically disconnected to the first pads. The first peripheral metal line is disposed at a first side of the row and electrically connected to the second pad and the third pad. The second peripheral metal line is disposed at a second side of the row and electrically connected to the second pad and the third pad.

In an embodiment, the first peripheral metal line is electrically disconnected to the first pads.

In an embodiment, the second peripheral metal line is electrically disconnected to the first pads.

In an embodiment, the first peripheral metal line includes a plurality of first branch portions and a plurality of second branch portions, each first branch portion disposed at a first side of each first pad and each second branch portion disposed at a second side of each first pad.

In an embodiment, the second peripheral metal line comprises a plurality of first branch portions and a plurality of second branch portions, each first branch portion disposed at a first side of each first pad and each second branch portion disposed at a second side of each first pad.

The second aspect of the invention provides a test process for probecard needles. The test process includes: providing a test structure according to the first aspect of the invention on a wafer; substantially contacting the probecard needles with the first pads to obtain first information; substantially contacting the probecard needles with the second pad and a first portion of the first pads to obtain second information; substantially contacting the probecard needles with the third pad and a second portion of the first pads to obtain third information; and determining whether any one of the probecard needles is anomalous by examining the first information, the second information, and the third information.

In an embodiment, the number of the probecard needles is equal to the number of the first pads.

In an embodiment, the row of the first pad consists of N first pads, and the first portion of the first pads consists of N−1 consecutive first pads starting from the first end of the row, and the second portion of the first pads consists of N−1 consecutive first pads starting from the second end of the row.

In an embodiment, the test process is conducted prior to a wafer acceptance testing.

In an embodiment, the test process is conducted during a wafer acceptance testing.

In an embodiment, the test process is conducted after a wafer acceptance testing.

In order to make the aforementioned and other objects, features and advantages of the present invention comprehensible, a preferred embodiment accompanied with figures is described in detail below.

BRIEF DESCRIPTION OF THE DRAWINGS

FIGS. 3A-3F are schematic diagrams illustrating the test process of the second embodiment.

Figure 1:
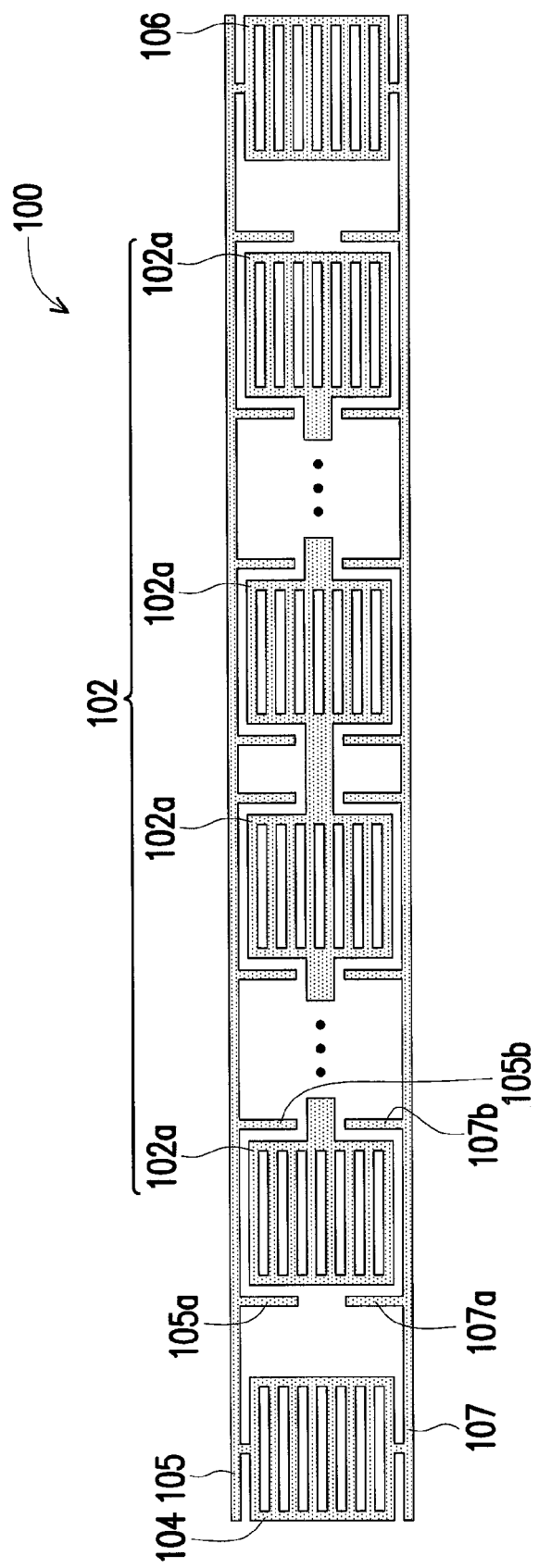
FIG. 1 is a schematic diagram illustrating a test structure for wafer acceptance test according to the first embodiment of the present invention.

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic diagram illustrating a test structure for wafer acceptance test according to the first embodiment of the present invention.

Referring to FIG. 1, a test structure 100 includes a row 102 of a plurality of first pads 102a. The first pads 102a are electrically connected to each other. The number of the first pads 102a is not particularly limited and may be, for example, 20 in an embodiment, and the solid dots in FIG. 1 represent omitting and identical units (i.e. the first pads 102a and the connecting portions therebetween).

A second pad 104 is disposed nearby the first end (in FIG. 1, the left end) of the row 102. The second pad 104 is electrically disconnected to the first pads 102a. Here, the phrase "electrically disconnected" applies only to the physical configuration of the test structure 100 itself. Specifically, the phrase "electrically disconnected" indicates that, there is no internal element of the test structure 100 electrically connecting the second pad 104 to the first pads 102a. There may be, of course, other external elements temporarily connecting the second pad 104 to the first pads 102a; for example, a probecard may temporarily make electrical connection between the second pad 104 and the first pads 102a during the test process detailed below.

A third pad 106 is disposed nearby the second end (in FIG. 1, the right end) of the row 102. The third pad 106 is electrically disconnected to the first pads 102a. A first peripheral metal line 105 is disposed at a first side (in FIG. 1, the upper side) of the row 102 and electrically connected to the second pad 104 and the third pad 106. A second peripheral metal line 107 is disposed at a second side (in FIG. 1, the lower side) of the row 102 and electrically connected to the second pad 104 and the third pad 106.

In the embodiment illustrated in FIG. 1, the first peripheral metal line 105 is electrically disconnected to the first pads 102a, and the second peripheral metal line 107 is also electrically disconnected to the first pads 102a.

Further, the first peripheral metal line 105 may include a plurality of branch portions 105a and 105b. Each branch portion 105a is disposed at a first side (in FIG. 1, the left side) of each first pad 102a, and each branch portion 105b is disposed at a second side (in FIG. 1, the right side) of each first pad 102a. Similarly, the second peripheral metal line 107 may include a plurality of branch portions 107a and 107b. Each branch portion 107a is disposed at the first side (in FIG. 1, the left side) of each first pad 102a, and each branch portion 107b is disposed at the second side (in FIG. 1, the right side) of each first pad 102a.

The first pad 102a, the second pad 104, the first peripheral metal line 105 (including the branch portions 105a, 105b, if any), the third pad 106, the second peripheral metal line 107 (including the branch portions 107a, 107b, if any) may be formed by a conventional photolithography process.

Typically, a wafer has hundreds of "sites," each of which is an exposed region corresponding to a single photomask. A test structure 100 may be formed in each of these sites during the fabrication process. Upon a wafer acceptance test, several sites are randomly or predeterminedly selected and undergo the test. After the completion of the test of one site and before the starting of that of another site, the probecard may be tested by using the test structure 100 to confirm if any anomaly (e.g. the probecard needles deformed, deviated from its original position, or blunted) occurs. The test process will be detailed in the following.

Figure 2:
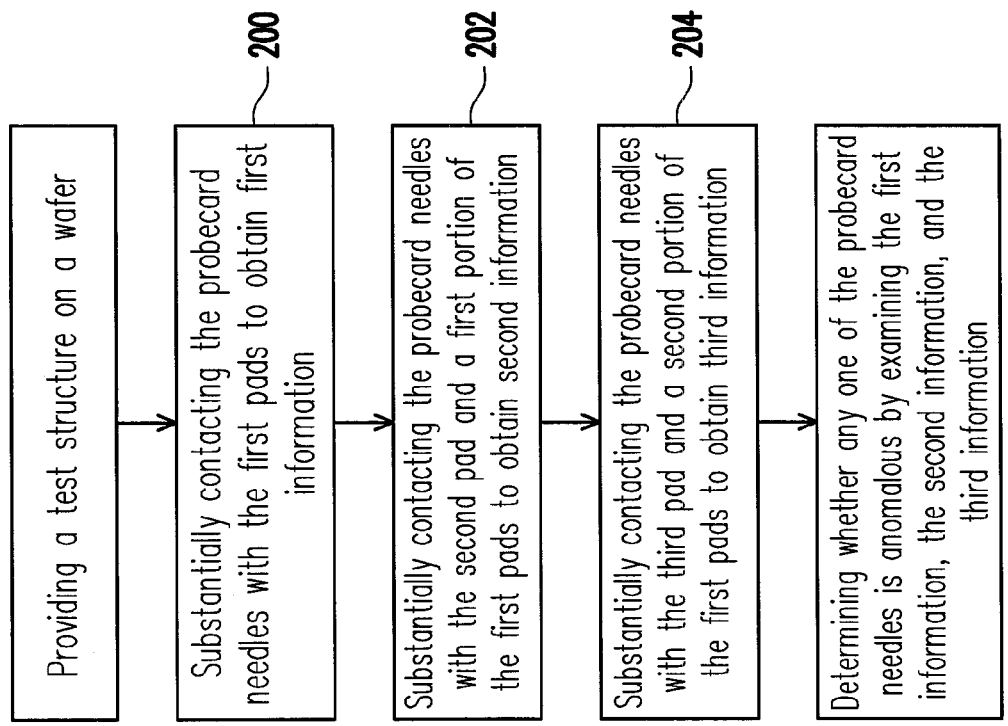
FIG. 2 is a process flow of a test process for probecard needles according to the second embodiment of the present invention.

FIG. 2 is a process flow of a test process for probecard needles according to the second embodiment of the present invention.

Referring to FIG. 2, with a test structure (e.g. that described in the first embodiment) provided on a wafer, the test process for probe needles includes a step 200 of contacting the probecard needles with the first pads to obtain first information, a step 202 of substantially contacting the probecard needles with the second pad and a first portion of the first pads to obtain second information, a step 204 of substantially contacting the probecard needles with the third pad and a second portion of the first pads to obtain third information, and, based on the first information, the second information, and the third information, to determine whether any of the probecard needles is anomalous. The test process will be explained more specifically with reference to FIGS. 3A-3F.

Referring to FIG. 3A, at step 200, tips of probecard needles (represented by the hollow circles) are substantially contacted with the first pads 102a. Here, the qualifier "substantially" is used to include situations where one or more of the probecard needles deviate from its (their) original position and thus may not contact with the corresponding pad(s).

In this embodiment, the number of the probecard needles is equal to that of the first pads 102a. The distance between adjacent tips of needles is substantially equal to that between adjacent first pads 102a so that each tip, when contacting the first pad 102a, locates on the center of each first pad 102a. Voltage difference may be established between one of the first pads 102a and another via the probecard needles, and the condition of the probecard needles can be confirmed, for example, by the electrical conductivity between the first pads 102a.

For example, if a tip $t_i$ deviates from its original position and does not contact with the corresponding first pad 102a, the electrical circuit between the tip $t_i$ and the tip $t_{i+1}$ opens. Infinity resistance will be read, and anomaly can be identified.

Referring to FIG. 3B, if a tip $t_j$ deviates from its original position and is still in contact with the corresponding first pad 102a, the magnitude of the electrical current running from tip $t_j$, through the first pad 102a, then to the tip $t_{j+1}$, would decrease due to the poor contact between the tip $t_j$ and the first pad 102a, again, indicating the presence of anomaly.

Referring to FIG. 3C, however, if a tip $t_k$ deviates from its original position but still is in good contact with the corresponding first pad 102a, the resistance change may be too small to identify the anomaly. Therefore, additional test steps such as step 202 or step 204 shall be added to address this issue.

Referring to FIG. 3D, at step 202, the probecard needles are substantially contacted with the second pad 104 and a first portion of the first pads 102a. In this embodiment, the first portion of the first pads 102a includes all of the first pads 102a except the rightmost one. In other words, the first portion of the first pads 102a consists of N−1 consecutive first pads 102a starting from the leftmost first pad 102a, wherein N is the total number of the first pads 102a. The second pad 104 is electrically disconnected to the first pads 102a. Therefore, electrical circuit between the tip of the probecard needle in contact with the second pad 104 ($t_1$) and the tip of a probecard needle in its normal state (e.g. $t_{k+1}$) is an open circuit. In contrast, the electrical circuit between tip $t_1$ and tip $t_k$ is shorted since the tip $t_k$ deviates from its original position and contacts with the first peripheral metal line 105. Voltage difference between $t_1$ and $t_k$ will drive a current through the first peripheral metal line 105, thus indicating the anomaly.

FIGS. 3A-3D depict the situation where the tips ($t_i$, $t_{j+1}$, and $t_k$) deviate upward. If, instead, one of the probecard needles deviates downward and is in good contact with the corresponding first pad 102a, the anomaly can be identified at step 202 by similar mechanism described above. However, if the leftmost (or rightmost) tip deviates slightly from its original position (e.g. $t_1$ in FIG. 3E) and the remainder of the tips are in their normal position, the anomaly cannot be detected, neither by step 200 nor step 202, since the electrical circuit between $t_1$ and any other tips remains short at step 200 and remains open at step 202. Thus a complementary test step is required.

Referring to FIG. 3F, at step 204, the probecard needles are substantially contacted with the third pad 106 and a second portion of the first pads 102a. In this embodiment, the second portion of the first pads 102a includes all of the first pads 102a except the leftmost one. In other words, the second portion of the first pads 102a consists of N−1 consecutive first pads 102a starting from the rightmost first pad 102a, wherein N is the total number of the first pads 102a. The third pad 106 is electrically disconnected to the first pads 102a. Therefore, electrical circuit between tip $t_m$ and tip $t_2$ is open. In contrast, the electrical circuit between tip $t_1$ and tip $t_m$ is shorted since the tip $t_1$ deviates from its original position and contacts with the first peripheral metal line 105. Voltage difference between $t_1$ and $t_m$ will drive a current through the first peripheral metal line 105, thus indicating the anomaly.

The test structure used in the test process of the second embodiment does not necessarily include the branch portions described in the first embodiments. However, if the branch portions are included, not only the anomaly depicted in FIGS. 3A-3E, but also the anomaly in which a tip deviates leftward or rightward can be identified, based on the same mechanism explained above.

It shall be noticed that, the step 200, the step 202, and the step 204 are not limited to proceed in the aforementioned order. The test process may be started with any of these steps, followed by another, and ended up with the remainder.

Depending on the occasion, the test process of the second embodiments may be conducted prior to, after, or during a wafer acceptance testing.

Accordingly, the present invention provides a test structure for wafer acceptance test and a test process for probecard needles using the test structure. Anomaly of the probecard needles can be found by the test process even if the needles only deviate slightly from its original position. Formation of the test structure can be easily incorporated in the conventional fabrication process. Thus, the test structures can be provided on a wafer in large amount, i.e. each site on the wafer may be formed with a test structure. Upon a wafer acceptance test, after the completion of the test of one site and before the starting of that of another site, the probecard may be tested by using the test structure to confirm if any anomaly occurs. This "in-line" test can find the anomaly more timely and reduce the possibility of damaging the components on the wafer with the anomalous probecard needles.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A test structure for wafer acceptance test comprising:
    a row of a plurality of first pads electrically connecting to each other;
    a second pad disposed in the vicinity of a first end of the row, wherein the second pad is electrically disconnected to the first pads,
    a third pad disposed in the vicinity of a second end of the row, wherein the third pad is electrically disconnected to the first pads;
    a first peripheral metal line disposed at a first side of the row and electrically connected to the second pad and the third pad; and
    a second peripheral metal line disposed at a second side of the row and electrically connected to the second pad and the third pad.

2. The test structure of claim 1, wherein the first peripheral metal line is electrically disconnected to the first pads.

3. The test structure of claim 1, wherein the second peripheral metal line is electrically disconnected to the first pads.

4. The test structure of claim 1, wherein the first peripheral metal line comprises a plurality of first branch portions and a plurality of second branch portions, each first branch portion disposed at a first side of each first pad and each second branch portion disposed at a second side of each first pad.

5. The test structure of claim 1, wherein the second peripheral metal line comprises a plurality of first branch portions and a plurality of second branch portions, each first branch portion disposed at a first side of each first pad and each second branch portion disposed at a second side of each first pad.

6. A test process utilizing the test structure of claim 1 for probecard needles comprising:
    providing the test structure on a wafer;
    substantially contacting the probecard needles with the first pads to obtain first information;
    substantially contacting the probecard needles with the second pad and a first portion of the first pads to obtain second information;
    substantially contacting the probecard needles with the third pad and a second portion of the first pads to obtain third information; and
    determining whether any one of the probecard needles is anomalous by examining the first information, the second information, and the third information.

7. The test process of claim 6, wherein the number of the probecard needles is equal to the number of the first pads.

8. The test process of claim 6, wherein the row consists of N first pads, and the first portion of the first pads consists of N−1 consecutive first pads starting from the first end of the row, and the second portion of the first pads consists of N−1 consecutive first pads starting from the second end of the row.

9. The test process of claim 6, wherein the test process is conducted prior to a wafer acceptance testing.

10. The test process of claim 6, wherein the test process is conducted during a wafer acceptance testing.

11. The test process of claim 6, wherein the test process is conducted after a wafer acceptance testing.

12. The test process of claim 6, wherein the first peripheral metal line is electrically disconnected to the first pads.

13. The test process of claim 6, wherein the second peripheral metal line is electrically disconnected to the first pads.

14. The test process of claim 6, wherein the first peripheral metal line comprises a plurality of first branch portions and a plurality of second branch portions, each first branch portion disposed at a first side of each first pad and each second branch portion disposed at a second side of each first pad.

15. The test process of claim 6, wherein the second peripheral metal line comprises a plurality of first branch portions and a plurality of second branch portions, each first branch portion disposed at a first side of each first pad and each second branch portion disposed at a second side of each first pad.

* * * * *